US012755791B2

(12) United States Patent
Lee et al.

(10) Patent No.: US 12,755,791 B2
(45) Date of Patent: Oct. 6, 2026

(54) RE-DRIVING DATA TO A SUB-BLOCK DURING PROGRAMMING OF MULTIPLE SUB-BLOCKS

(71) Applicant: Micron Technology, Inc., Boise, ID (US)

(72) Inventors: Eric N. Lee, San Jose, CA (US); Tomoko Ogura Iwasaki, San Jose, CA (US); Alessio Urbani, Rome (IT); Justin Bates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/605,169

(22) Filed: Mar. 14, 2024

(65) Prior Publication Data

US 2024/0312525 A1 Sep. 19, 2024

Related U.S. Application Data

(60) Provisional application No. 63/452,931, filed on Mar. 17, 2023.

(51) Int. Cl.

| | |
|---|---|
| ***G11C 16/10*** | (2006.01) |
| ***G11C 16/04*** | (2006.01) |
| ***G11C 16/08*** | (2006.01) |

(52) U.S. Cl.

CPC ........ *G11C 16/102* (2013.01); *G11C 16/0433* (2013.01); *G11C 16/08* (2013.01)

(58) Field of Classification Search

CPC ... G11C 16/102; G11C 16/0433; G11C 16/08; G11C 11/5628; G11C 16/0483; G11C 16/10

See application file for complete search history.

(56) References Cited

U.S. PATENT DOCUMENTS

| | | | | |
|---|---|---|---|---|
| 2006/0133149 | A1 | 6/2006 | Chae et al. | |
| 2007/0014157 | A1 | 1/2007 | Hung et al. | |
| 2008/0101120 | A1 | 5/2008 | Park et al. | |
| 2008/0291735 | A1 | 11/2008 | Dong et al. | |
| 2011/0013458 | A1* | 1/2011 | Seol | H10B 41/20 365/189.04 |
| 2011/0310673 | A1 | 12/2011 | Cho et al. | |
| 2017/0255410 | A1* | 9/2017 | Shiga | G11C 16/3459 |
| 2022/0051735 | A1 | 2/2022 | Rajagiri et al. | |
| 2022/0310160 | A1* | 9/2022 | Khakifirooz | G11C 16/0483 |
| 2023/0038237 | A1* | 2/2023 | Lee | G11C 16/08 |
| 2023/0050955 | A1* | 2/2023 | Zhao | G11C 16/0483 |
| 2023/0134281 | A1 | 5/2023 | Raimondo et al. | |
| 2023/0207019 | A1 | 6/2023 | Miranda et al. | |
| 2023/0352092 | A1 | 11/2023 | Ameen et al. | |
| 2024/0249776 | A1 | 7/2024 | Diep et al. | |

* cited by examiner

*Primary Examiner* — Alexander Sofocleous
*Assistant Examiner* — James S. Wells
(74) *Attorney, Agent, or Firm* — Lowenstein Sandler LLP

(57) ABSTRACT

A request to execute a programming operation to program multiple sub-blocks including a first sub-block and a second sub-block of a memory device is identified. A first drive operation is executed to load first data into a first select gate drain (SGD) associated with the first sub-block. Following completion of the first drive operation, a second drive operation is executed to load second data into a second SGD associated with the second sub-block. Following completion of the second drive operation, a third drive operation is executed to re-load the first data into the first SGD.

11 Claims, 13 Drawing Sheets

RE-DRIVING DATA TO A SUB-BLOCK DURING PROGRAMMING OF MULTIPLE SUB-BLOCKS

CROSS-REFERENCE TO RELATED APPLICATION

This application claims the benefit of U.S. Provisional Application No. 63/452,931, titled "Re-driving Data to a Sub-block During Programming of Multiple Sub-blocks," filed Mar. 17, 2023, which is hereby incorporated herein by reference in its entirety.

TECHNICAL FIELD

Embodiments of the disclosure relate generally to memory sub-systems, and more specifically, relate to re-driving data to sub-block during programming of multiple sub-blocks of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
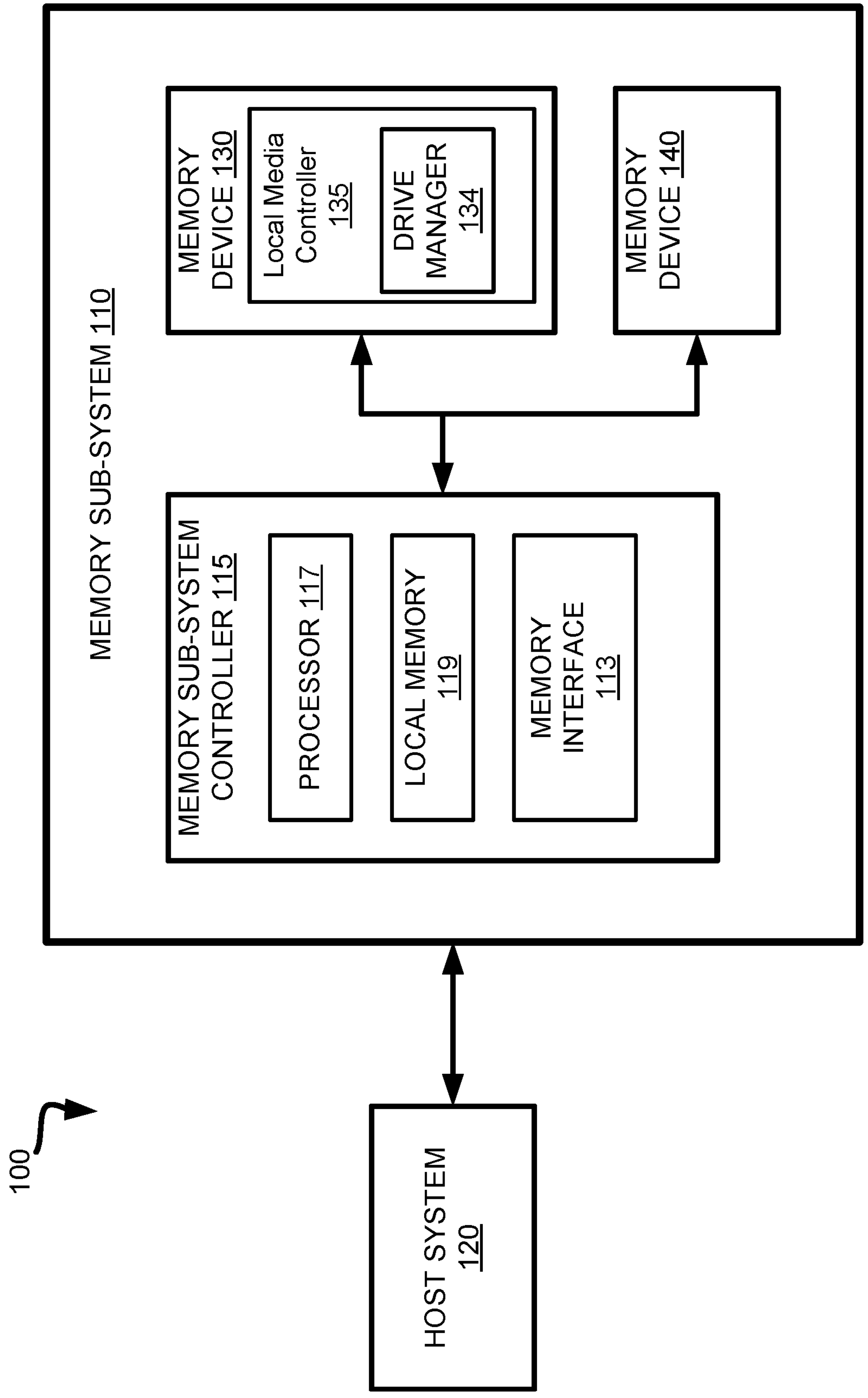
FIG. 1A illustrates an example computing system that includes a memory sub-system, in accordance with one or more embodiments of the present disclosure.

Aspects of the present disclosure are directed to re-driving data to sub-block during programming of multiple sub-blocks of a memory device in a memory device in a memory sub-system. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage Vt (also referred to as the "threshold voltage") such that the source-drain electric current is low for the control gate voltage ($V_{CG}$) being below the threshold voltage, $V_{CG}$<Vt. The current increases substantially once the control gate voltage has exceeded the threshold voltage, $V_{CG}$>Vt. Because the actual geometry of the electrodes and gates varies from cell to cell, the threshold voltages can be different even for cells implemented on the same die. The cells can, therefore, be characterized by a distribution P of the threshold voltages, $P(Q, V_T)=dW/dV_T$, where dW represents the probability that any given cell has its threshold voltage within the interval [Vt, Vt+dVt] when charge Q is placed on the cell.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell (1 bit for upper page (UP) data and 1 bit for lower page (LP) data) and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell (1 bit for UP data, 1 bit for LP data and 1 bit for extra page (XP) data) and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell (1 bit for UP data, 1 bit for LP data, 1 bit for XP data, and 1 bit for top page (TP) data) and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits of information for n pages. A memory device can include one or more arrays of memory cells such as SLCs, MLCs, TLCs, QLCS, PLCs, etc. or any combination of such. For example, a memory device can include an SLC portion, and an MLC portion, a TLC portion, a QLC portion, or a PLC portion of cells.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$).

Performing a programming operation may involve floating the pillars of both selected sub-block and unselected sub-blocks by turning off both the select gate drain (SGD) and select gate source (SGS) signals that control the respective drain side and source side select transistors coupled to each string of memory cells. Once the pillars are floated, the unselected wordlines can be discharged to a predefined potential, thus boosting down the potential at the pillar of the selected sub-block to a corresponding negative potential. As a result, the programming voltage pulses, which can be sequentially applied to the target (selected) wordline, can be reduced by the value of the negative potential of the pillar while maintaining the same level of programming stress and the program inhibit stress as the level which would be achieved without applying the negative potential to the pillar.

The portion of the array of memory cells to be programmed can be a block which can include strings of memory cells that can be grouped into sub-blocks (e.g., memory pages). Each sub-block of the block is coupled to a bitline. For example, a first sub-block can include a first select gate drain (SGD) (e.g., $SGD_0$), a first select gate source (SGS) (e.g., $SGS_0$), and a first string of memory cells coupled therebetween, a second sub-block can include a second SGD ($SGD_1$), a second SGS ($SGS_1$), and a second string of memory cells coupled therebetween, and so on. Accordingly, the sub-block can include an arrangement of alternating SGDs including a first subset of even-numbered SGDs (e.g., $SGD_0$, $SGD_2$, $SGD_4$, etc.) and a second subset of odd-numbered SGDs (e.g., $SGD_1$, $SGD_3$, $SGD_5$, etc.). It is noted that an SGS may be shared across multiple sub-blocks.

In some cases, a ganged programming operation can be executed to program sets of memory cells of two or more sub-blocks (e.g., programming two or more sub-blocks or pages in parallel). During execution of the ganged program operation, a ganged or grouped drive sub-operation is executed to load the two or more sub-blocks of the memory array with data prior to application of a program pulse to the corresponding wordline. The ganged drive sub-operation can be performed by a first drive sub-operation to activate a first SGD with first data (i.e., load the first data into a first pillar corresponding to the first sub-block being programmed) followed by a second drive sub-operation to activate a second SGD with second data (i.e., load the second data into a second pillar corresponding to the second sub-block being programmed). However, the further loading of data during the second drive sub-operation can disturb the program biasing in the corresponding pillar. In this regard, the data loading enabled by the subsequent or second drive sub-operation causes disturb to the previously loaded data. Disadvantageously, the program bias disturb can cause undesirable program offset placement inaccuracy during the application of the programming pulse.

Aspects of the present disclosure address the above and other deficiencies by executing a re-drive operation to load previously driven data to a SGD associated with a first sub-block during a programming operation to program multiple sub-blocks (also referred to as a "ganged programming operation"). In an embodiment, in response to a request to execute a ganged programming operation to program a first sub-block and a second sub-block of a memory array, a first drive operation is executed to load first data to a first SGD associated with the first sub-block being programmed. The first drive operation includes the application of a first drive pulse to the first SGD to load the first data. Following completion of the first drive sub-operation, a second drive operation is executed to load second data to a second SGD associated with the second sub-block being programmed. The second drive operation includes the application of a second drive pulse to the second SGD to load the second data. Following completion of the second drive operation, a third drive operation (also referred to as a re-drive operation) is executed to re-load the first data to the first SGD. In an embodiment, the drive operations can be performed using an even-odd-even programming sequence, where the first drive operation is performed on an even-numbered SGD (e.g., the first sub-block is $SGD_0$), the second drive operation is performed on an odd-numbered SGD (e.g., the second sub-block is $SGD_1$) and the re-drive operation is performed on the even-numbered SGD (e.g., $SGD_0$).

In an embodiment, the drive operations can be performed using an odd-even-odd programming sequence, where the first drive operation is performed on an odd-numbered SGD (e.g., the first sub-block is $SGD_1$), the second drive operation is performed on an even-numbered SGD (e.g., the second sub-block is $SGD_2$) and the re-drive operation is performed on the odd-numbered SGD (e.g., $SGD_1$).

According to embodiment, the re-drive operation can be executed "outside" or before the application of a programming pulse to a wordline associated with the first sub-block and the second sub-block. According to this embodiment, following completion of the re-drive operation (e.g., the re-loading of the previously loaded data to the corresponding SGD), the programming pulse is applied to the wordline associated with the multiple sub-blocks being programmed (e.g., the first sub-block and the second sub-block).

According to an embodiment, the re-drive operation can be executed "inside" or during the application of a programming pulse to a wordline associated with the first sub-block and the second sub-block. According to this embodiment, the re-drive operation (e.g., the re-loading of the previously loaded data to the corresponding SGD) and the application of the programming pulse are performed concurrently. In an embodiment, the re-drive operation executed inside or during the programming pulse can be an extended pulse (i.e., an extended re-drive pulse having an extended or longer pulse width as compared to the pulse width of the first drive pulse (i.e., the first drive operation). For example, the first drive pulse applied to the first SGD can have a first pulse width and the re-drive pulse applied to the first SGD can have a second pulse width, where the second pulse width is greater than the first pulse width.

Advantageously, any number of sub-blocks can be programmed in accordance with the ganged programming operation (e.g., three sub-blocks, four sub-blocks, etc.), such that a re-drive operation is performed for each of the corresponding SGD except for the last SGD. For example, for a ganged programming operation to program three sub-blocks (a first sub-block associated with $SGD_0$, a second sub-block associated with $SGD_1$, and a third sub-block associated with $SGD_2$), multiple re-drive operations can be executed (e.g., a first re-drive operation to re-load the data to $SGD_0$ and a second re-drive operation to re-load the data to $SGD_1$). In an embodiment, in this example, a re-drive operation is not performed with respect to the last SGD (e.g., $SGD_2$).

Accordingly, the use of the one or more re-drive operations associated with the execution of a ganged programming operations results in a reduction in the disturb in the programming bias. Advantageously, the one or more re-drive pulses are applied to re-drive or re-load previously driven and disturbed data to restore the program bias in one or more pillars of the memory device. The re-drive operation results in a reduction in undesirable program offsets during the application of the programming pulse to the wordline of the multiple sub-blocks that are being programmed during the execution of a ganged programming operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, compute express link (CXL) interface). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a CXL interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device.

The local media controllers 135 can implement a drive manager 134 that can manage the driving or loading of data to SGDs associated with multiple sub-blocks during execution of a ganged programming operation (e.g., the concurrent programming of two more sub-blocks of a memory array). In an embodiment, the drive manager 134 executes one or more re-drive operations (e.g., a driving pulse that is applied to re-drive previously driven and disturbed data).

The drive manager 134 identifies a request for the execution of a ganged programming to program multiple sub-blocks (e.g., two or more sub-blocks) of the memory array of one or more memory devices. In an embodiment, as part of the execution of the ganged programming operation, the drive manager 134 executes a first drive operation to load data to be programmed to a first SGD associated the first sub-block. The drive manager 134 executes a second drive operation to load data to be programmed to a second SGD associated with the second sub-block. According to embodiments, to mitigate the disturb of the first data due to the second drive operation, the drive manager 134 executes a third drive operation (i.e., a re-drive operation) including application of a drive pulse to the first SGD to re-drive or re-load the previously loaded data. In some embodiments, the drive manager 134 can perform multiple re-drive operations to re-drive previously driven data to multiple SGDs during a ganged programming operation associated with multiple sub-blocks.

According to an embodiment, the drive manager 134 can execute the one or more re-drive operations outside or before the application of the programming pulse to the wordline associated with the multiple target sub-blocks. According to an embodiment, the drive manager 134 can execute the re-drive operation inside or concurrently with the application of the programming pulse to the wordline associated with the multiple target sub-blocks. In an e embodiment, the drive manager 134 can execute the re-drive operation including application of an extended drive pulse (i.e., a drive pulse having a larger pulse width) to the SGD being re-driven during the application of the programming pulse to the wordline.

Figure 1B:
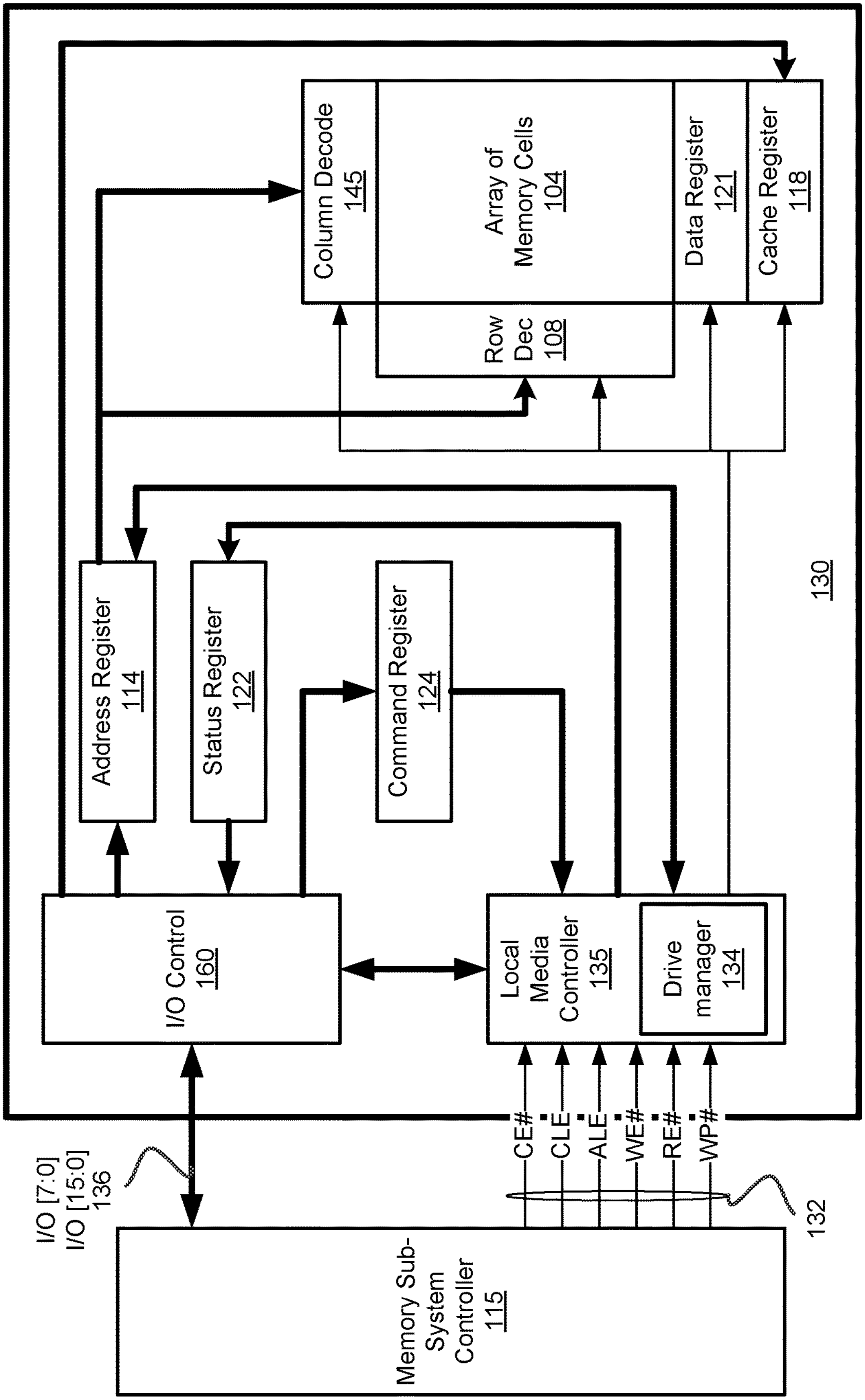
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 145 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 145 to latch the address signals prior to decoding. A command page buffer 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 145 to control the row decode circuitry 108 and column decode circuitry 145 in response to the addresses. In one embodiment, local media controller 135 includes the drive manager 134, which can implement the execution of at least a portion of the prologue sub-operations of a programming operation during a data loading stage to reduce a total programming time associated with the programming operation of a set of target memory cells of the memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 121 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command page buffer 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 121 for programming the array of memory cells 104.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
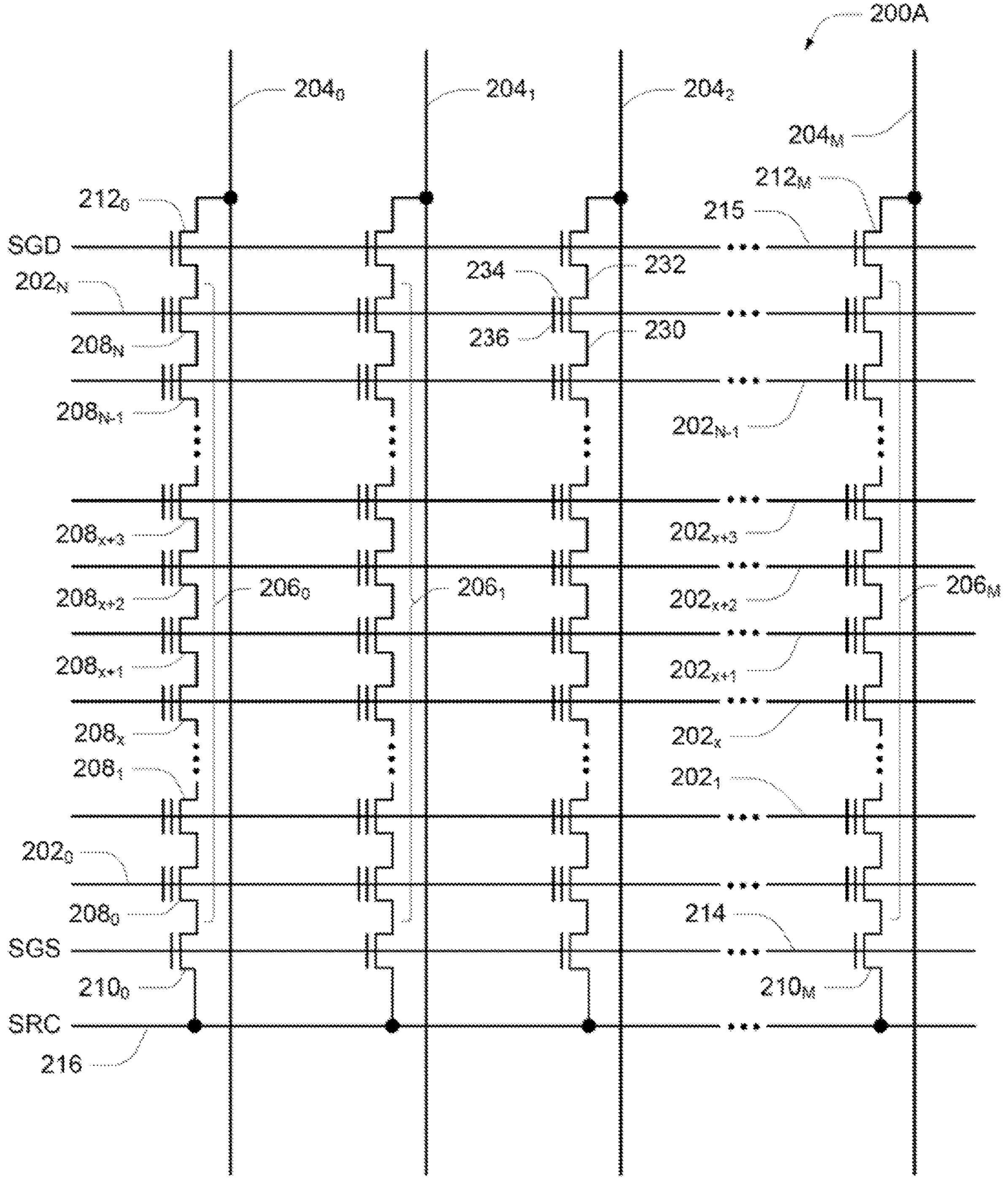
FIG. 2A-2D are schematics of portions of an array of memory cells as could be used in a memory of the type described with reference to FIG. 1B, in accordance with one or more embodiments of the present disclosure.
Figure 2B:
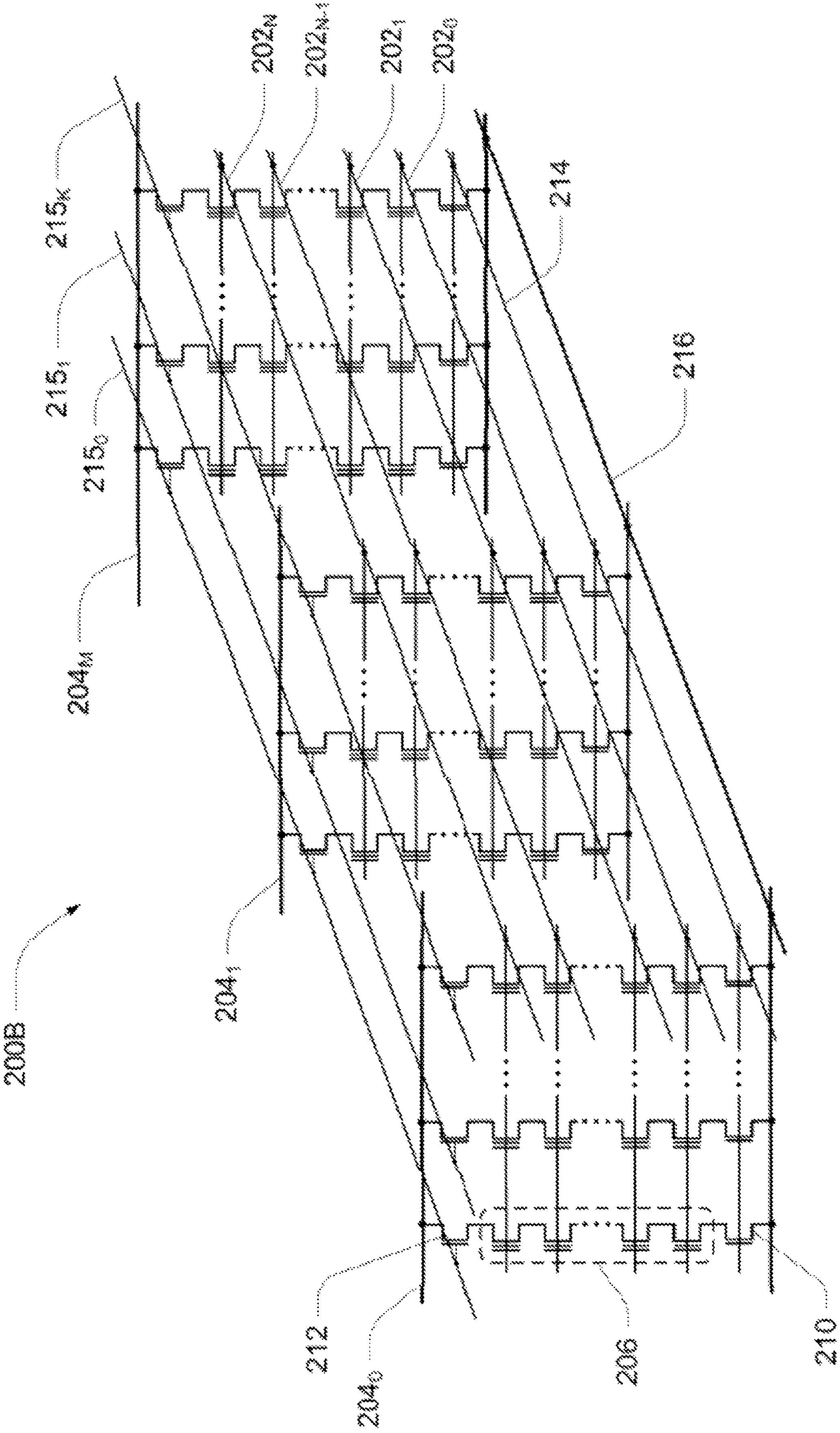
Figure 2C:
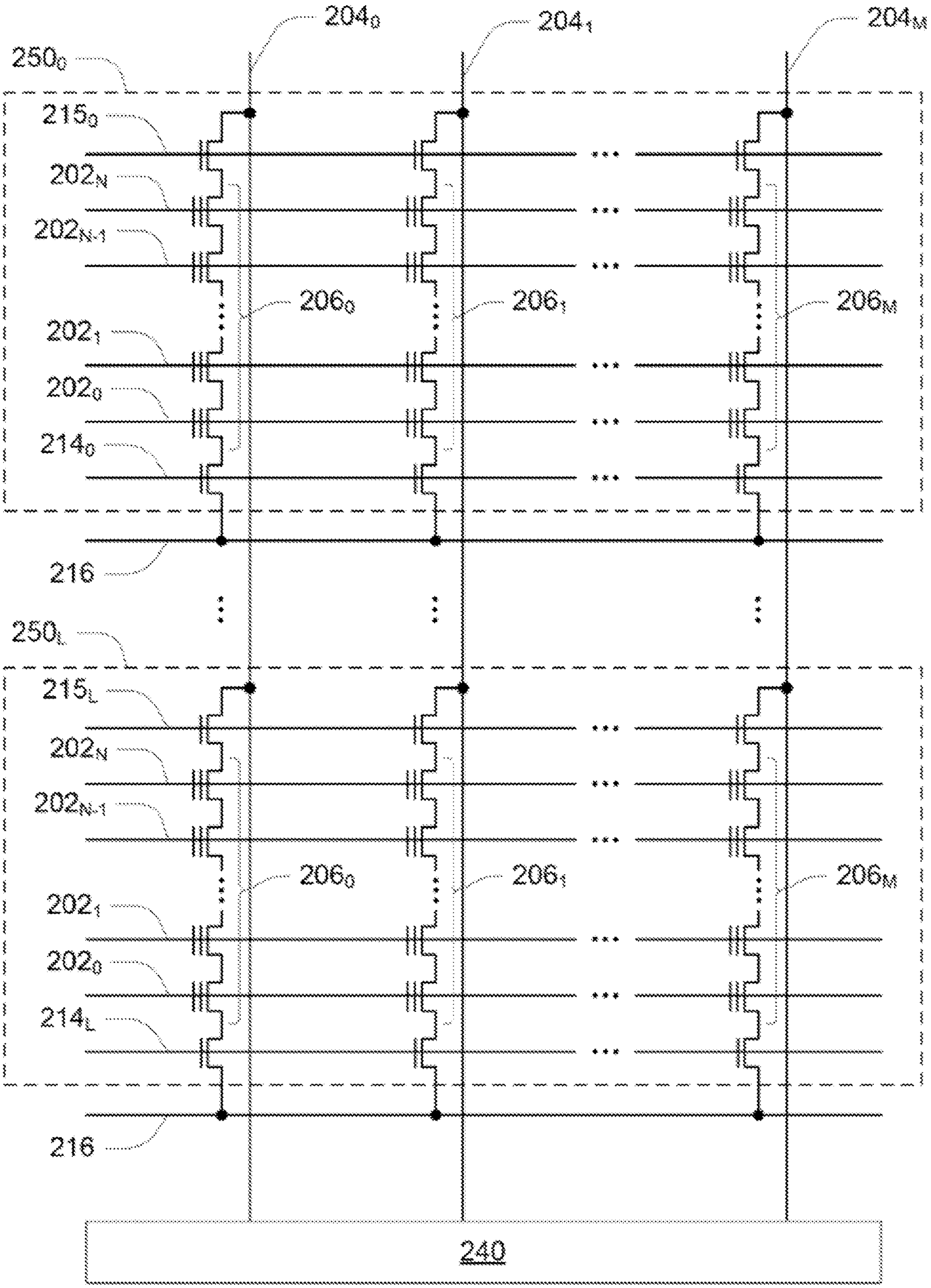

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $\mathbf{202}_0$ to $\mathbf{202}_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected a to given wordline 202. For example, memory cells 208 commonly connected to wordline $\mathbf{202}_N$ and selectively connected to even bitlines 204 (e.g., bitlines $\mathbf{204}_0$, $\mathbf{204}_2$, $\mathbf{204}_4$, etc.) may be one physical page of memory cells 208 (e.g., even memory cells) while memory cells 208 commonly connected to wordline $\mathbf{202}_N$ and selectively connected to odd bitlines 204 (e.g., bitlines $\mathbf{204}_1$, $\mathbf{204}_3$, $\mathbf{204}_5$, etc.) may be another physical page of memory cells 208 (e.g., odd memory cells). Although bitlines $\mathbf{204}_3$-$\mathbf{204}_5$ are not explicitly depicted in FIG. 2A, it is apparent from the figure that the bitlines 204 of the array of memory cells 200A may be numbered consecutively from bitline $\mathbf{204}_0$ to bitline $\mathbf{204}_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $\mathbf{202}_0$-$\mathbf{202}_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $\mathbf{206}_0$ to $\mathbf{206}_M$. Each string 206 can be connected (e.g., selectively connected) to a source line 216 (SRC) and can include memory cells $\mathbf{208}_0$ to $\mathbf{208}_N$. The memory cells 208 of each string 206 can be connected in series between a select gate 210, such as one of the select gates 2100 to 210M, and a select gate 212, such as one of the select gates $\mathbf{212}_0$ to $\mathbf{212}_M$. In some embodiments, the select gates 2100 to 210M are source-side select gates (SGS) and the select gates $\mathbf{212}_0$ to $\mathbf{212}_M$ are drain-side select gates. Select gates $\mathbf{210}_0$ to $\mathbf{210}_M$ can be connected to a select line 214 (e.g., source-side select line) and select gates $\mathbf{212}_0$ to 212 can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $\mathbf{208}_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $\mathbf{208}_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $\mathbf{204}_0$-$\mathbf{204}_M$ by a select gate 212 and to the SRC 216 by a select gate 210. Multiple strings 206 can be selectively connected to the same bitline 204. Subsets of strings 206 can be connected to their respective bitlines 204 by biasing the select lines $\mathbf{215}_0$-$\mathbf{215}_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C depicts groupings of NAND strings 206 into blocks of memory cells 250, e.g., blocks of memory cells $\mathbf{250}_0$-$\mathbf{250}_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $\mathbf{215}_0$. The source 216 for the block of memory cells $\mathbf{250}_0$ can be a same source as the source 216 for the block of memory cells $\mathbf{250}_L$. For example, each block of memory cells $\mathbf{250}_0$-$\mathbf{250}_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $\mathbf{250}_0$-$\mathbf{250}_L$.

The bitlines $\mathbf{204}_0$-$\mathbf{204}_M$ can be connected (e.g., selectively connected) to a buffer portion 240, which can be a portion of the page buffer 152 of the memory device 130. The buffer portion 240 can correspond to a memory plane (e.g., the set of blocks of memory cells $\mathbf{250}_0$-$\mathbf{250}_L$). The buffer portion 240 can include sense circuits (which can include sense amplifiers) for sensing data values indicated on respective bitlines 204.

Figure 2D:
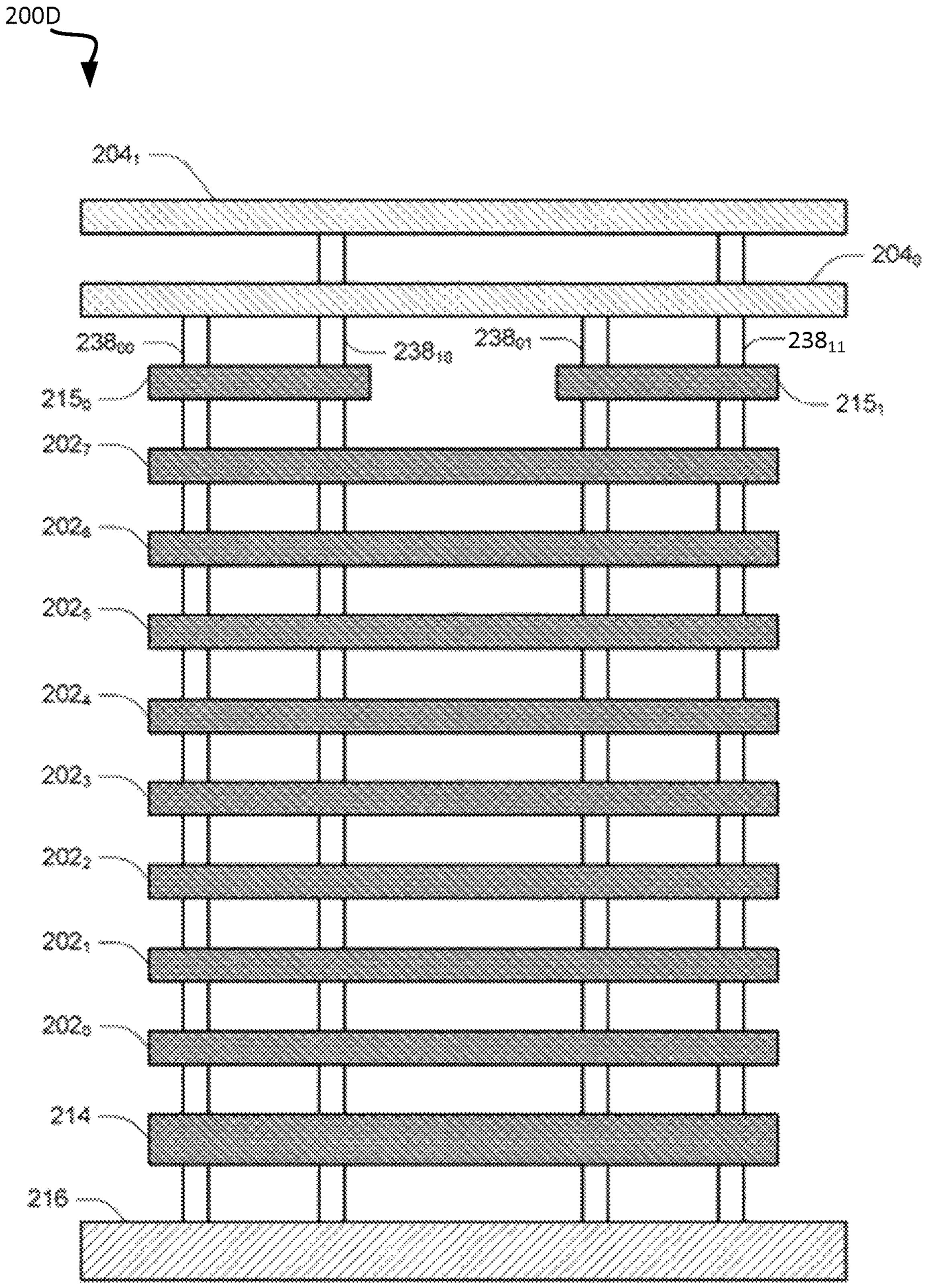

FIG. 2D is a diagram of a portion of an array of memory cells 200D (e.g., a portion of the array of memory cells 104). Channel regions (e.g., semiconductor pillars) $\mathbf{238}_{00}$ and $\mathbf{238}_{01}$ represent the channel regions of different strings of series-connected memory cells (e.g., strings 206 of FIGS. 2A-2C) selectively connected to the bitline $\mathbf{204}_0$. Similarly, channel regions $\mathbf{238}_{10}$ and $\mathbf{238}_{11}$ represent the channel regions of different strings of series-connected memory cells (e.g., NAND strings 206 of FIGS. 2A-2C) selectively connected to the bitline $\mathbf{204}_1$. A memory cell (not depicted in FIG. 2D) may be formed at each intersection of an wordline 202 and a channel region 238, and the memory cells corresponding to a single channel region 238 may collectively form a string of series-connected memory cells (e.g., a string 206 of FIGS. 2A-2C). Additional features might be common in such structures, such as dummy wordlines, segmented channel regions with interposed conductive regions, etc.

Figure 3:
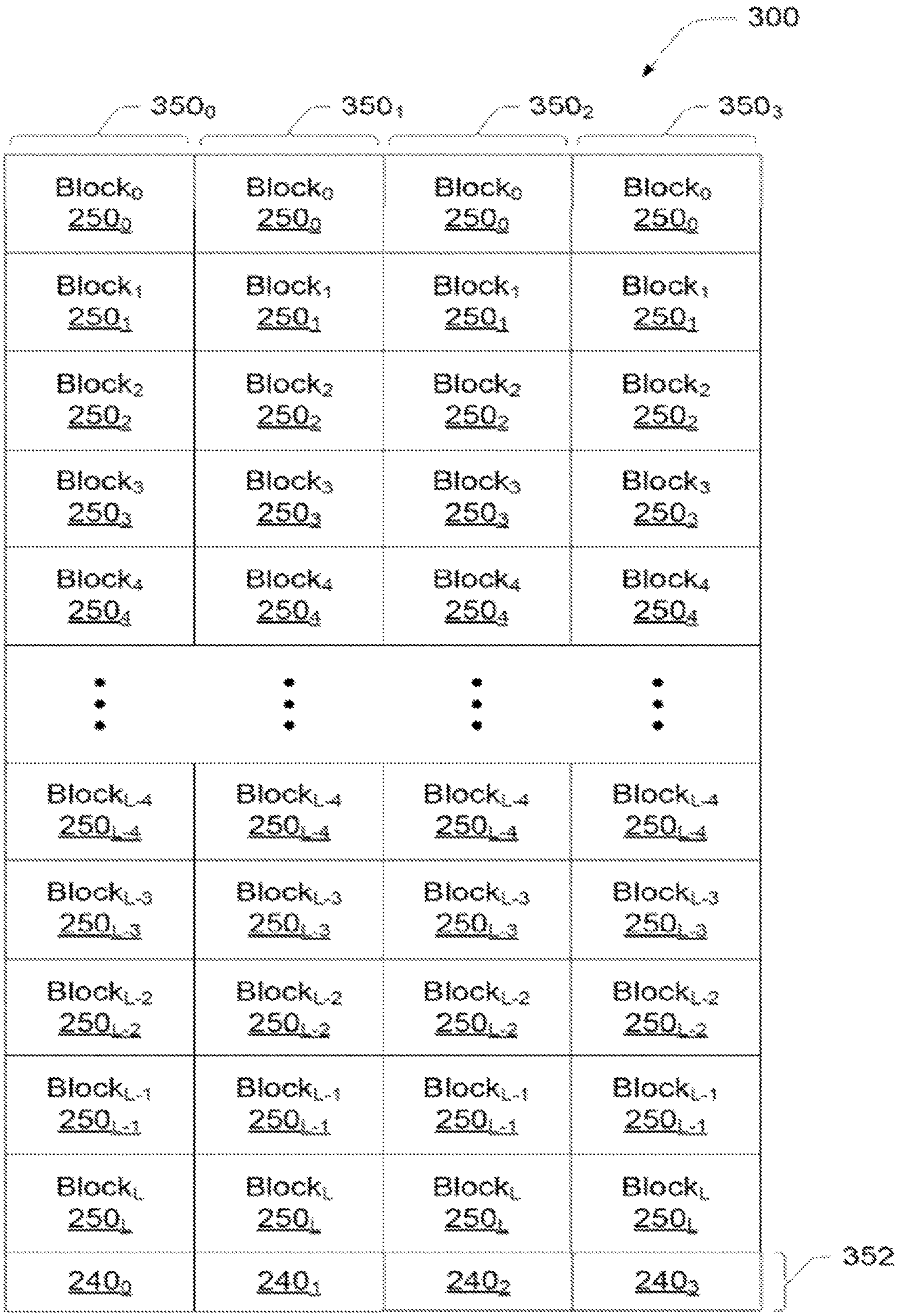
FIG. 3 is a block schematic of a portion of an array of memory cells as could be used in a memory of the type described with reference to FIG. 1B, in accordance with one or more embodiments of the present disclosure.

FIG. 3 is a block schematic of an example portion of an array of memory cells 300 as could be used in a memory of the type described with reference to FIG. 1B. The array of memory cells 300 is depicted as having four memory planes 350 (e.g., memory planes $\mathbf{350}_0$-$\mathbf{350}_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $\mathbf{250}_0$-$\mathbf{250}_L$).

Figure 4:
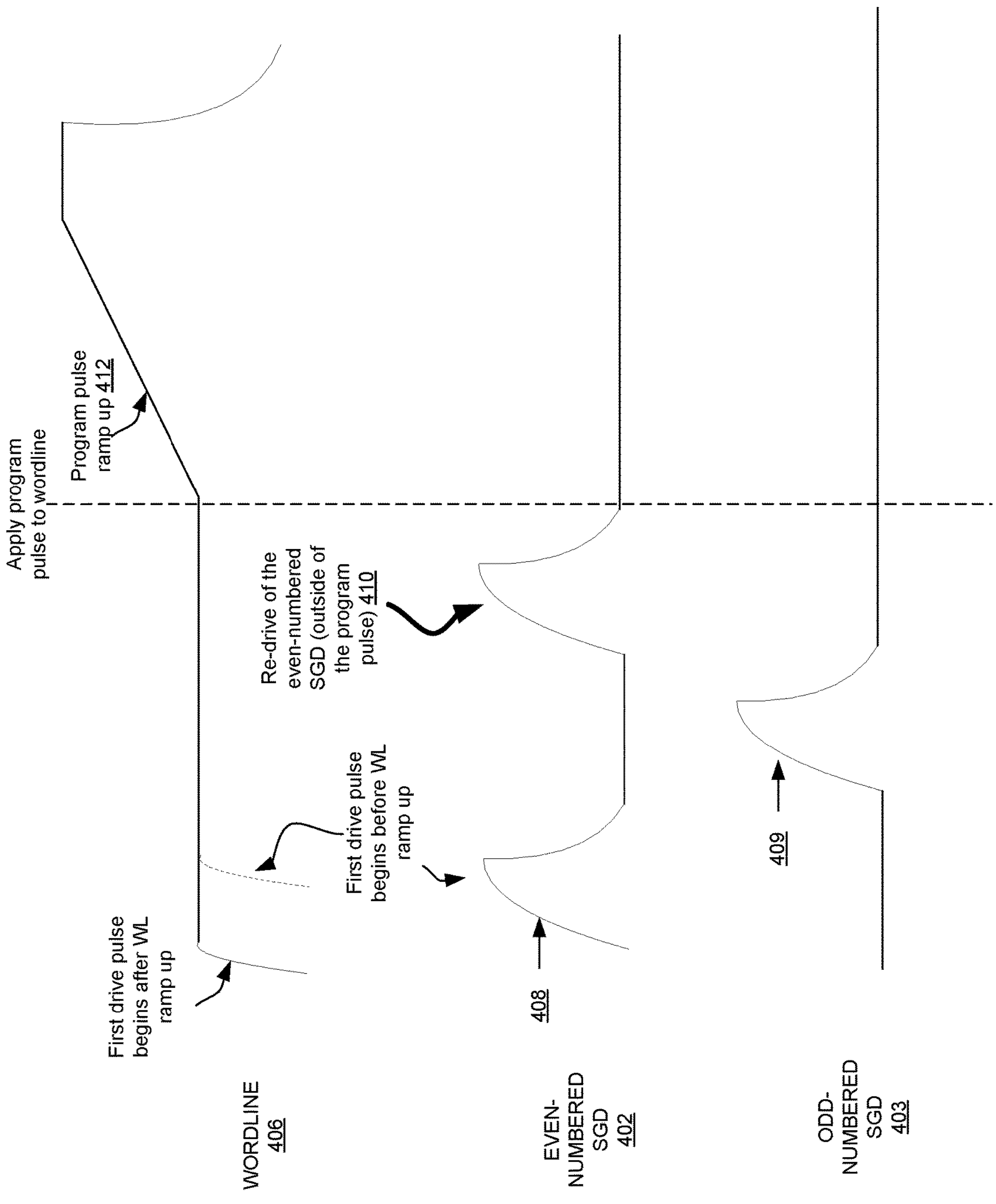
FIG. 4 illustrates example waveforms associated with a ganged program operation with a re-drive operation to program a first sub-block associated with an even-numbered select gate drain and a second sub-block associated with an odd-numbered select gate drain of a memory array of a memory device, in accordance with one or more embodiments of the present disclosure.

FIG. 4 illustrates example waveforms associated with a ganged program operation with a re-drive operation to program a first sub-block associated with an even-numbered SGD 402 (e.g., $SGD_0$) and a second sub-block associated with an odd-numbered SGD 403 (e.g., $SGD_1$) of a memory array of a memory device. In an embodiment, in response to request for the ganged programming operation, a ramp up of the wordline 406 associated with the target sub-blocks (e.g., the first sub-block and the second sub-blocks) is initiated. In an embodiment, a first drive operation is executed to apply a first drive pulse 408 to load first data to the even-numbered SGD 402. In one embodiment, as shown by the solid line, the first drive pulse 408 is applied after the wordline ramp up. In another embodiment, as shown by the dashed line, application of the first drive pulse 408 to the even-numbered SGD 402 is initiated before the wordline ramp up. The example illustrated by the dashed line in which the first drive operation begins before the wordline ramp up can result in a reduction in total programming time as compared to the embodiment where the first drive pulse begins after the wordline ramp up.

As illustrated in FIG. 4, following completion of the first drive operation 408, a second drive operation is executed to load second data to the odd-numbered SGD 403. In an embodiment, the execution of the second drive operation includes the application of a second drive pulse 409 to load second data to the odd-numbered SGD 403. In the embodiment illustrated in FIG. 4, a third drive operation or re-drive operation is executed to load the first data to the even-numbered SGD 402. As illustrated, the re-drive operation (e.g., the third drive operation) includes the application of a re-drive pulse 410 to the even-numbered SGD 402 "outside" or prior to the application of the program pulse to the wordline 406 associated with the multiple target sub-blocks (e.g., the first sub-block and the second sub-block). As shown in FIG. 4, following the application of the re-drive pulse 410, the program pulse is applied and the program pulse ramp up is executed. It is noted that although the example illustrated in FIG. 4 includes a ganged programming of two sub-blocks with a re-drive operation according to an even-odd-even programming sequence, an alternate odd-even-odd sequence can be performed in accordance with the embodiments of the present disclosure. For example, if using an odd-even-odd sequencing, the first drive pulse is applied to the odd-numbered SGD, the second drive pulse is applied to the even-numbered SGD, and the third drive pulse (i.e., the re-drive pulse) is applied to the odd-numbered SGD.

Figure 5:
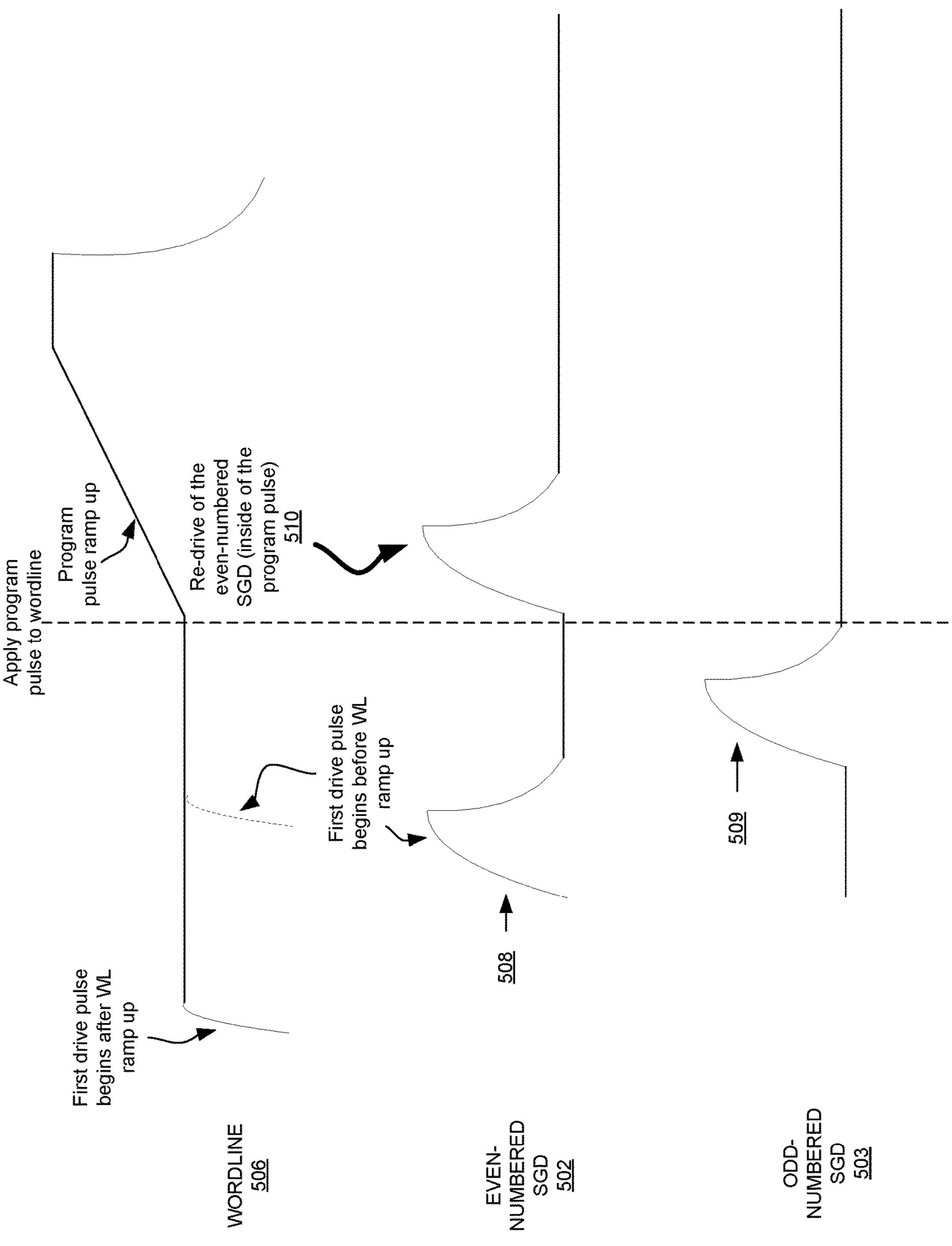
FIG. 5 illustrates example waveforms associated with a ganged program operation including a re-drive operation to program a first sub-block associated with an even-numbered select gate drain and a second sub-block associated with an odd-numbered select gate drain of a memory array of a memory device, in accordance with one or more embodiments of the present disclosure.

FIG. 5 illustrates example waveforms associated with a ganged program operation including a re-drive operation to program a first sub-block associated with an even-numbered SGD 502 (e.g., $SGD_0$) and a second sub-block associated with an odd-numbered SGD 503 (e.g., $SGD_1$) of a memory array of a memory device. In an embodiment, in response to request for the ganged programming operation, a ramp up of the wordline 506 associated with the target sub-blocks (e.g., the first sub-block and the second sub-blocks) is initiated. In an embodiment, a first drive operation is executed to apply a first drive pulse 508 to load first data to the even-numbered SGD 502.

Like the embodiments described above with reference to FIG. 4, in one embodiment, as shown by the solid line in FIG. 5, the first drive pulse 508 is applied after the wordline ramp up. In another embodiment, as shown by the dashed line in FIG. 5, the first drive pulse 508 is applied to load the first data into the even-numbered SGD 502 before the wordline ramp up. The example illustrated in FIG. 5 by the dashed line in which the first drive operation begins before the wordline ramp up can result in a reduction in total programming time as compared to the embodiment where the first drive pulse begins after the wordline ramp up.

As illustrated in FIG. 5, following completion of the first drive operation 508, a second drive operation is executed to load second data to the odd-numbered SGD 503. In an embodiment, the execution of the second drive operation includes the application of a second drive pulse 509 to load second data into the odd-numbered SGD 503. In the embodiment, a third drive operation or re-drive operation is executed to load the first data into the even-numbered SGD 502. As illustrated in FIG. 5, the re-drive operation (e.g., the third drive operation) includes the application of a re-drive pulse 510 to the even-numbered SGD 502 "inside" or during the application of the program pulse to the wordline 506 associated with the multiple target sub-blocks (e.g., the first sub-block and the second sub-block). As shown in FIG. 5, following the application of the re-drive pulse 510, the program pulse is applied and the program pulse ramp up is executed. Like the example of FIG. 4, the example illustrated in FIG. 5 includes a ganged programming of two sub-blocks with a re-drive operation according to an even-odd-even programming sequence, an alternate odd-even-odd sequence can be performed in accordance with the embodiments of the present disclosure.

Figure 6:
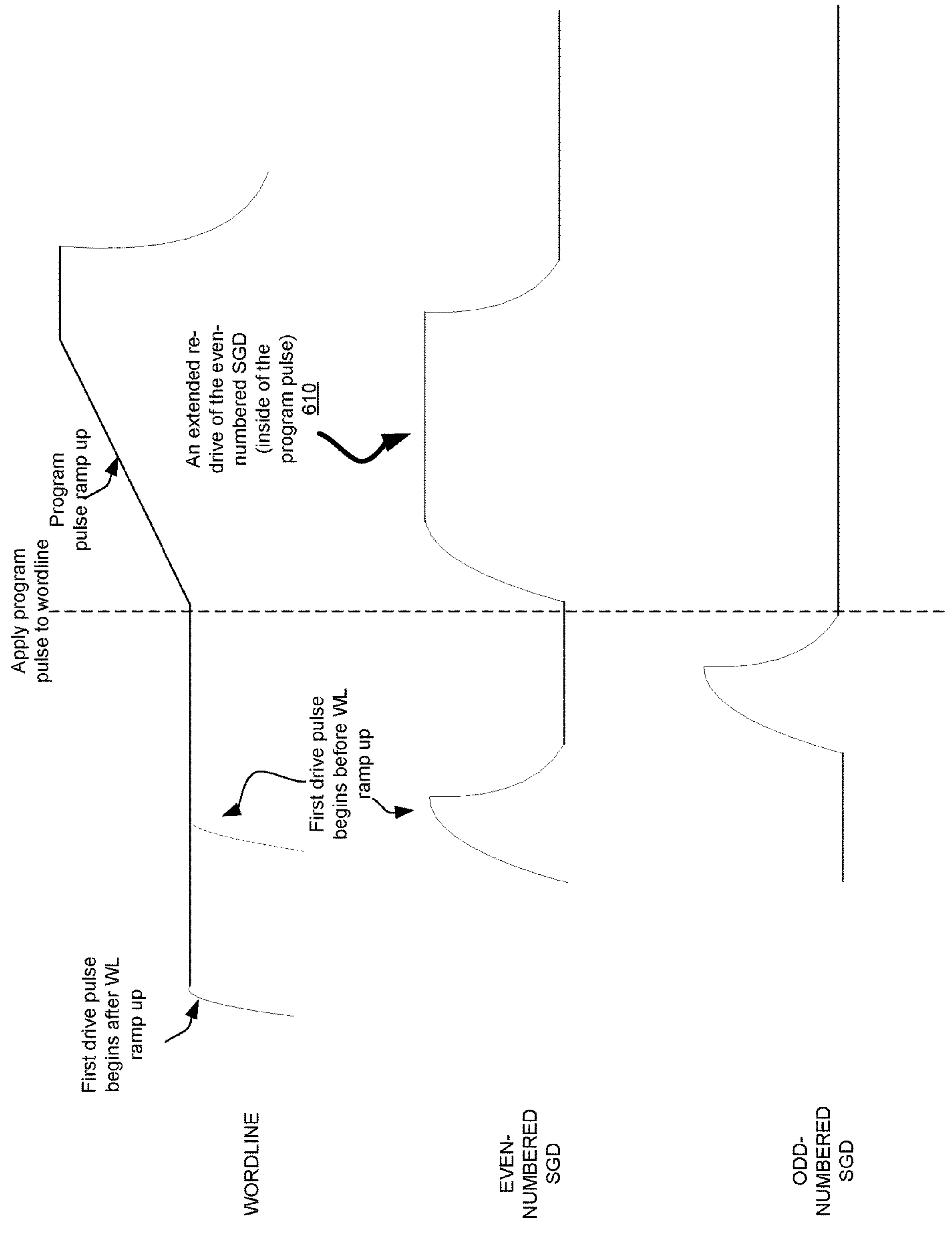
FIG. 6 illustrates example waveforms associated with a ganged program operation including a re-drive operation including an extended re-drive pulse to program a first sub-block associated with an even-numbered select gate drain and a second sub-block associated with an odd-numbered select gate drain of a memory device, in accordance with one or more embodiments of the present disclosure.

FIG. 6 illustrates example waveforms associated with a ganged program operation including a re-drive operation including an extended re-drive pulse to program a first sub-block associated with an even-numbered SGD 602 (e.g., $SGD_0$) and a second sub-block associated with an odd-numbered SGD 603 (e.g., $SGD_1$) of a memory array of a memory device. As illustrated, the extended re-drive pulse 610 is applied inside or during the program pulse. According to embodiments, the extended re-drive pulse 610 has a different width than the re-drive pulse 510. In an embodiment, the extended re-drive pulse 610 has a larger pulse width, as compared to the re-drive pulse 510 of FIG. 5. For example, the re-drive pulse 510 of FIG. 5 has a first pulse width and the extended re-drive pulse 610 of FIG. 6 has a second pulse width, where the second pulse width is greater than the first pulse width. In another embodiment, the extended re-drive pulse has a smaller pulse width, as compared to the re-drive pulse.

In an embodiment, the processing logic (i.e., the drive manager 134) can apply the extended re-drive pulse 610 of FIG. 6 to reduce the overall programming time associated with the ganged programming operation. According to the embodiment, shown in FIG. 6 an embodiment, in response to request for the ganged programming operation, a ramp up of the wordline 506 associated with the target sub-blocks (e.g., the first sub-block and the second sub-blocks) is initiated. In an embodiment, a first drive operation is executed to apply a first drive pulse 508 to load first data to the even-numbered SGD 502.

Figure 7:
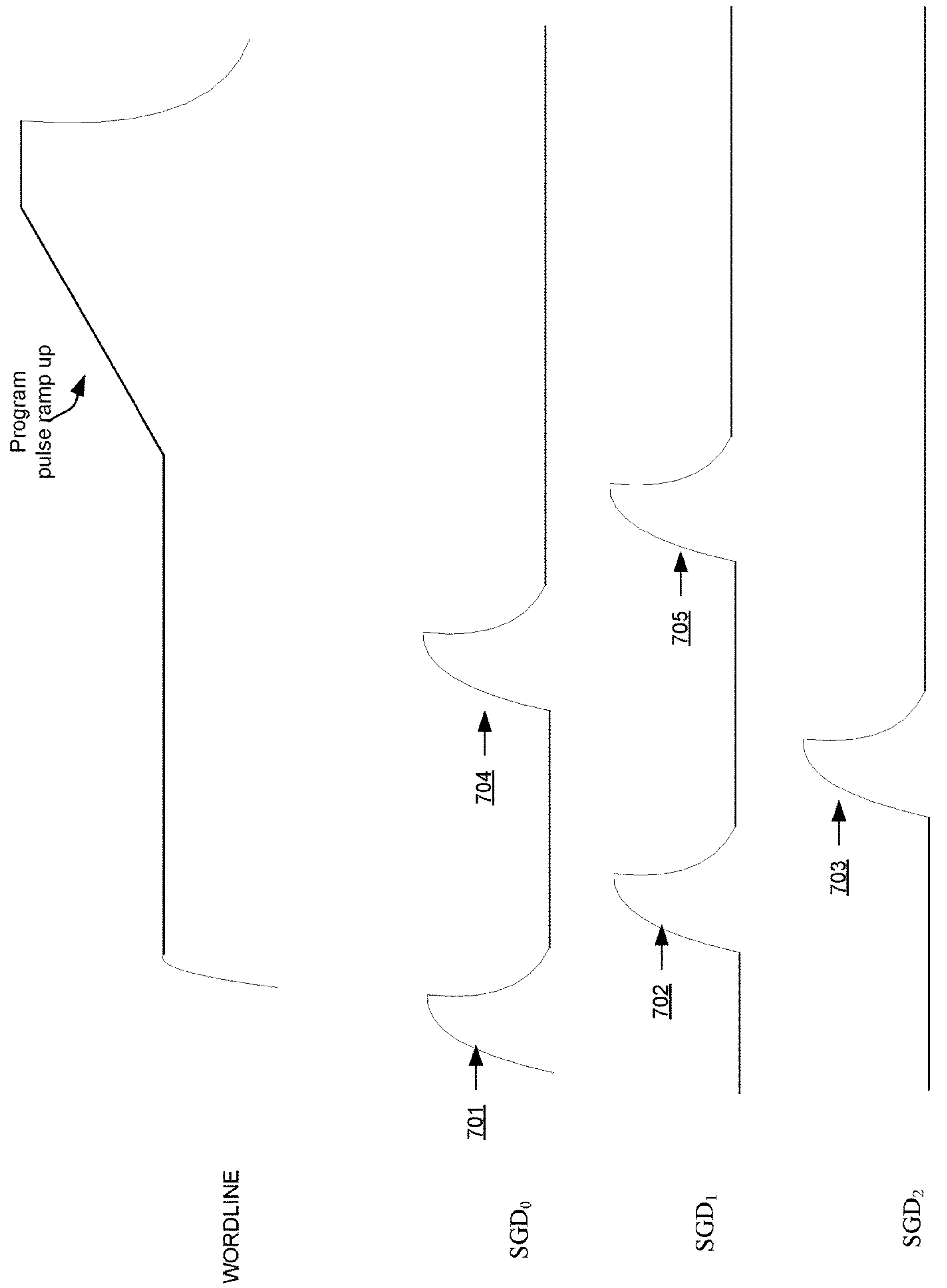
FIG. 7 illustrates example waveforms associated with a ganged programming operation to program three sub-blocks including multiple re-drive operations, in accordance with one or more embodiments of the present disclosure.

According to embodiments, although the examples shown in FIGS. 4-6 illustrated a two sub-block ganged programming operation, the ganged programming operation including one or more re-drive operations can be performed for any number of sub-blocks. For example, FIG. 7 illustrates waveforms associated with a ganged programming operation to program three sub-blocks including multiple re-drive operations. As shown in FIG. 7, an example even-odd-even programming sequence is performed to program a first sub-block associated with $SGD_0$, a second sub-block associated with $SGD_1$, and a third sub-block associated with $SGD_2$. According to embodiments, a first drive operation is performed including application of a first drive pulse 701 to load first data into $SGD_0$ for programming the first sub-block. Following completion of the first drive operation, a second drive operation is performed including application of a second drive pulse 702 to load second data into $SGD_1$ for programming the second sub-block. As illustrated, following completion of the second drive operation, a third drive operation is performed including application of a third drive pulse 703 to load third data into $SGD_2$ for programming the third sub-block.

In an embodiment, to mitigate any program bias disturb associated with the first data and the second data, following completion of the third drive operation, a first re-drive operation 704 is performed to re-load the first data into $SGD_0$. In an embodiment, a second re-drive operation 705 is performed to re-load the second data into $SGD_1$. Following the last re-drive operation (e.g., the second re-drive operation 705), the programming pulse is applied to program the three sub-blocks with the respective data previously loaded into the corresponding SGD (e.g., the first sub-block associated with $SGD_0$ is programmed with the first data, the second sub-block associated with $SGD_1$ is programmed with the second data, and the third sub-block associated with $SGD_2$ is programmed with the third data).

As illustrated in the example ganged programming of the three sub-blocks shown in FIG. 7, a re-drive operation is executed with respect to all of the SGDs (e.g., $SGD_0$ and $SGD_1$) except for the last SGD (e.g., $SGD_2$). In an embodiment, for example, if the ganged programming operation is executed to program N sub-blocks (where N is greater than 2), re-drive operations are performed for each of the N−1 sub-blocks, and no re-drive operation is performed with respect to the Nth sub-block.

Figure 8:
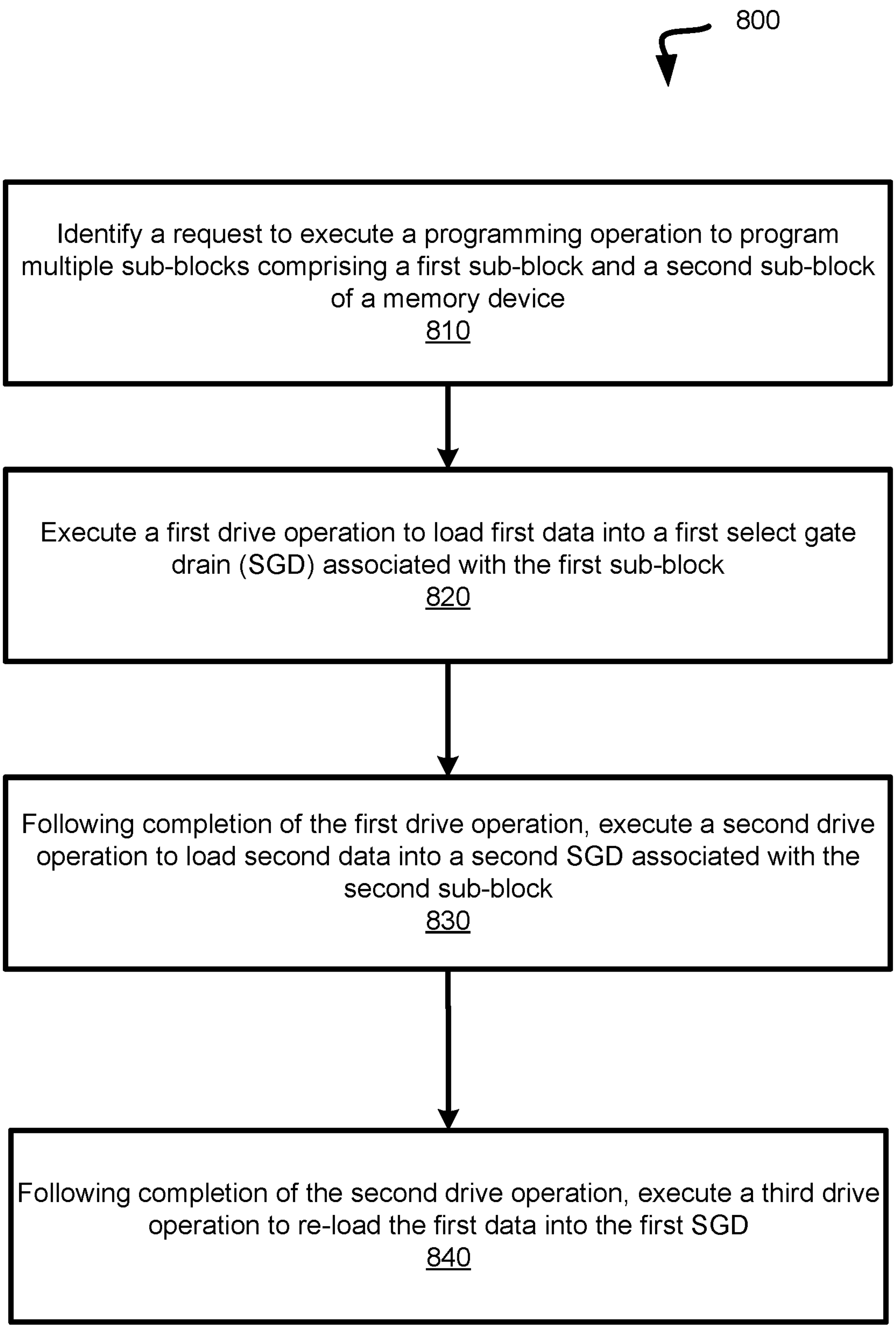
FIG. 8 is a flow diagram of an example method to execute a ganged programming operation including a re-drive operation to re-load data to a select gate drain, in accordance with one or more embodiments of the present disclosure.

FIG. 8 is a flow diagram of an example method 800 to execute a ganged programming operation including a re-drive operation to re-load data to a select gate drain, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the drive manager 134 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a request is identified. For example, processing logic (e.g., the drive manager 134 of FIGS. 1A-1B) can identify a request to execute a programming operation to program multiple sub-blocks including a first sub-block and a second sub-block of a memory device. In an embodiment, the request for the programming operation (e.g., a ganged programming operation to program multiple sub-blocks concurrently) is received from a host system.

At operation 820, a first operation is executed. For example, the processing logic can execute a first drive operation to load first data into a first select gate drain (SGD) associated with the first sub-block. In an embodiment, if an even-odd-even programming sequence is used, the first SGD can be $SGD_{even}$ (e.g., $SGD_0$). In an embodiment, execution of the first drive operation causes a first drive pulse to be applied to the first SGD to load the first data therein for programming the first sub-block.

At operation 830, a second operation is executed. For example, following completion of the first drive operation, the processing logic can execute a second drive operation to load second data into a second SGD associated with the second sub-block. In an embodiment, again assuming an even-odd-even programming sequence is used, the second SGD can be $SGD_{odd}$ (e.g., $SGD_1$). In an embodiment, execution of the second drive operation causes a second drive pulse to be applied to the second SGD to load the second data therein for programming the second sub-block.

At operation 840, a second operation is executed. For example, following completion of the second drive operation, the processing logic can execute a third drive operation to re-load the first data into the first SGD. In an embodiment, execution of the third drive operation (i.e., a re-drive operation) causes a third drive pulse to be applied to the first SGD to re-load the previously driven first data into the first SGD. Advantageously, any portion of the first data that was disturbed as a result of the second drive operation is re-loaded to restore the program bias in the pillar associated with the first sub-block.

According to embodiments, the processing logic causes ramping of the programming pulse applied to the wordline associated with the first sub-block and the second sub-block. According to an embodiment, the re-drive pulse (i.e., the pulse of the third drive operation) can be applied "outside" or before the ramping of the programming pulse applied to the wordline. In an embodiment, the re-drive pulse can be applied "inside" or during the ramping of the programming pulse applied to the wordline. According to an embodiment, the re-drive pulse can have an extended or larger pulse width, as compared to the first drive pulse and the second drive pulse. In this embodiment, the extended re-drive pulse having the larger pulse width can result in a reduction in a total programming time associated with the ganged programming operation.

In an embodiment, in the ganged programming operation described above with respect to FIG. 8 can include the programming of additional sub-blocks (e.g., a third sub-block, a fourth sub-block, etc.). For example, in an embodiment, the processing logic can execute additional drive operations and re-drive operations for a set of multiple SGDs associated with the multiple sub-blocks. As described in detail above, a drive and re-drive operation can be performed for each of the sub-blocks being programmed, such that no re-drive operation is performed with respect to the last sub-block in the set.

Figure 9:
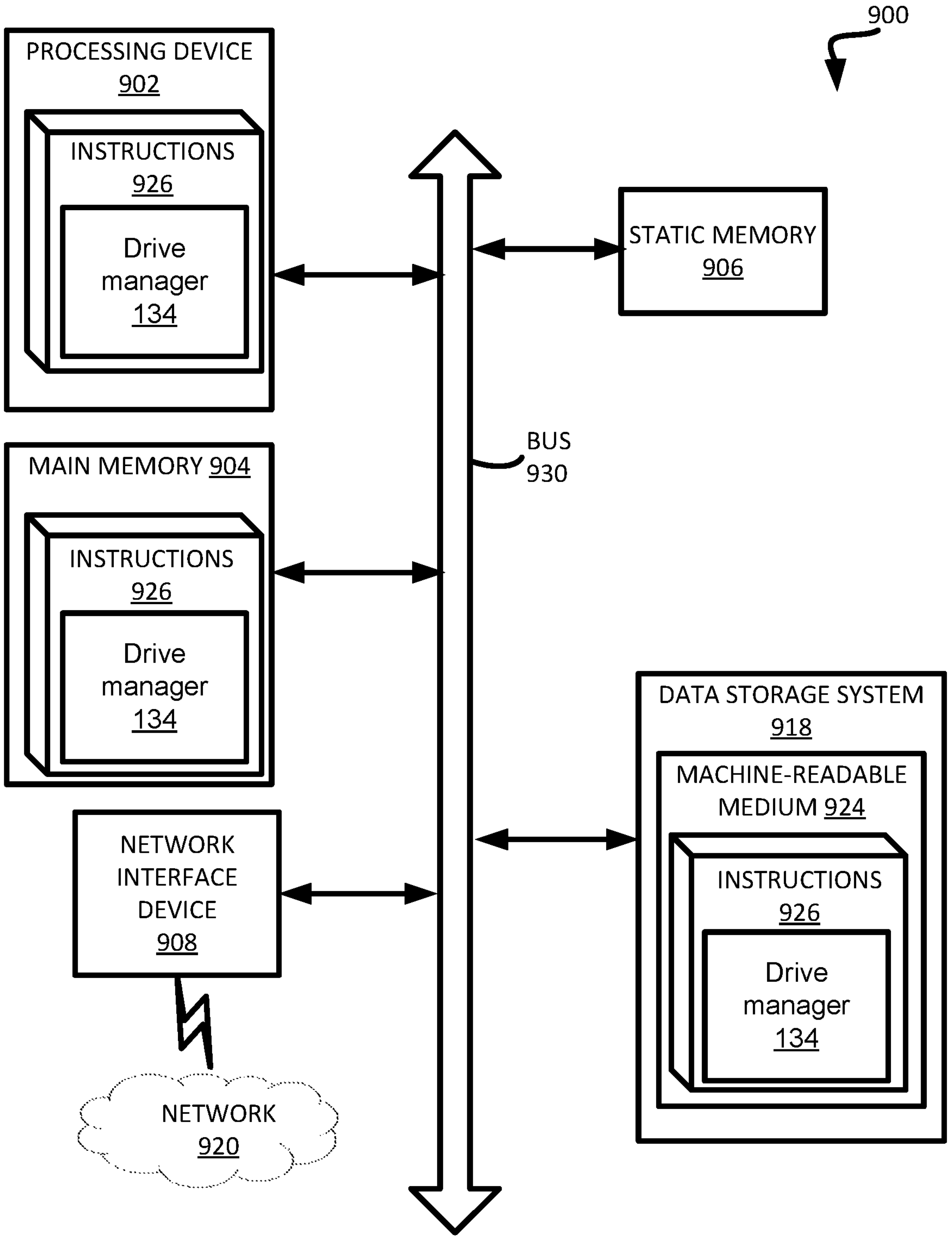
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the drive manager 134 of FIG. 1A and FIG. 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a program manager (e.g., the drive manager 134 of FIG. 1A and FIG. 1B). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's page buffers and memories into other data similarly represented as physical quantities within the computer system memories or page buffers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array; and control logic, operatively coupled with the memory array, the control logic configured to:

identify a request to execute a programming operation to program a plurality of sub-blocks comprising a first sub-block and a second sub-block of a memory device;

execute a first drive operation to load first data into a first select gate drain (SGD) associated with the first sub-block;

following completion of the first drive operation, execute a second drive operation to load second data into a second SGD associated with the second sub-block;

following completion of the second drive operation, execute a third drive operation to re-load the first data into the first SGD; and cause a ramped programmed pulse to be applied to a wordline associated with the first sub-block and the second sub-block, wherein the third drive operation is executed during application of the ramped programming pulse to the wordline.

2. The memory device of claim 1, wherein a first drive pulse applied to the first SGD during the first drive operation has a first pulse width, and wherein a re-drive pulse of the third drive operation has a second pulse width that is different than the first pulse width.

3. The memory device of claim 1, wherein the first drive operation is initiated after initiating a ramping up of a wordline associated with the first sub-block and the second sub-block.

4. The memory device of claim 1, wherein the first drive operation is initiated prior to initiating a ramping up of a wordline associated with the first sub-block and the second sub-block.

5. A method comprising:

identifying, by a processing device, a request to execute a programming operation to program a plurality of sub-blocks comprising a first sub-block and a second sub-block of a memory device;

executing a first drive operation to load first data into a first select gate drain (SGD) associated with the first sub-block;

following completion of the first drive operation, execute a second drive operation to load second data into a second SGD associated with the second sub-block;

following completion of the second drive operation, execute a third drive operation to re-load the first data into the first SGD; and cause a ramped programmed pulse to be applied to a wordline associated with the first sub-block and the second sub-block, wherein the third drive operation is executed during application of the ramped programming pulse to the wordline.

6. The method of claim 5, wherein a first drive pulse applied to the first SGD during the first drive operation has a first pulse width, and wherein a re-drive pulse of the third drive operation has a second pulse width that is different than the first pulse width.

7. The method of claim 5, wherein the first drive operation is initiated after initiating a ramping up of a wordline associated with the first sub-block and the second sub-block.

8. The method of claim 5, wherein the first drive operation is initiated prior to initiating a ramping up of a wordline associated with the first sub-block and the second sub-block.

9. A non-transitory computer-readable storage medium comprising instructions that, when executed by a processing device, cause the processing device to perform operations comprising:

identifying a request to execute a programming operation to program a plurality of sub-blocks comprising a first sub-block and a second sub-block of a memory device;

executing a first drive operation to load first data into a first select gate drain (SGD) associated with the first sub-block;

following completion of the first drive operation, execute a second drive operation to load second data into a second SGD associated with the second sub-block;

following completion of the second drive operation, execute a third drive operation to re-load the first data into the first SGD; and cause a ramped programmed pulse to be applied to a wordline associated with the first sub-block and the second sub-block, wherein the third drive operation is executed during application of the ramped programming pulse to the wordline.

10. The non-transitory computer-readable storage medium of claim 9, wherein a first drive pulse applied to the first SGD during the first drive operation has a first pulse width, and wherein a re-drive pulse of the third drive operation has a second pulse width that is different than the first pulse width.

11. The non-transitory computer-readable storage medium of claim 9, wherein the first drive operation is initiated before initiating a ramping up of a wordline associated with the first sub-block and the second sub-block.

* * * * *